United States Patent
Wu et al.

(10) Patent No.: US 7,167,018 B1
(45) Date of Patent: *Jan. 23, 2007

(54) CIRCUITS, ARCHITECTURES, SYSTEMS AND METHODS FOR OVERVOLTAGE PROTECTION

(75) Inventors: Lei Wu, Sunnyvale, CA (US); Yonghua Song, Saratoga, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

This patent is subject to a terminal disclaimer.

(21) Appl. No.: 11/353,736

(22) Filed: Feb. 13, 2006

Related U.S. Application Data

(63) Continuation of application No. 10/606,907, filed on Jun. 26, 2003, now Pat. No. 7,026,839.

(51) Int. Cl.
*H03K 17/16* (2006.01)
(52) U.S. Cl. .......................................... 326/26; 326/82
(58) Field of Classification Search ............ 326/26–30, 326/82, 83
See application file for complete search history.

(56) References Cited

U.S. PATENT DOCUMENTS

| | | | |
|---|---|---|---|
| 3,946,251 A | 3/1976 | Kawagoe | |
| 5,166,561 A | 11/1992 | Okura | |
| 5,933,021 A | 8/1999 | Mohd | |
| 6,181,540 B1 | 1/2001 | Schoenfeld et al. | |
| 6,400,541 B1 | 6/2002 | Brett | |
| 6,483,683 B1 | 11/2002 | Stenström | |
| 6,738,248 B1 | 5/2004 | Jenkins et al. | |
| 2002/0126430 A1 | 9/2002 | Roohparvar | |
| 2003/0026052 A1 | 2/2003 | Spehar et al. | |

FOREIGN PATENT DOCUMENTS

GB 2 008 357 A 5/1979

*Primary Examiner*—Don Le

(57) ABSTRACT

Circuits, architectures, a system and methods for protecting against overvoltages in a high-speed differential signal or circuit. The circuit generally includes (a) a differential signal transmission line, (b) a common mode circuit coupled to and configured to reduce a swing of the differential signal transmission line, and (c) an overvoltage protection circuit coupled to the common mode circuit, wherein the common mode circuit is electrically interposed between the overvoltage protection circuit and the differential signal transmission line. The architectures and/or systems generally include an integrated circuit that embodies one or more of the inventive concepts disclosed herein. The method generally includes shunting the overvoltage to a ground potential through the termination circuit when the differential circuit receives the overvoltage, but otherwise processing the differential signal through circuitry coupled to the differential circuit. The present invention advantageously provides a satisfactory level of overvoltage protection for nearly all applications in which conventional CMOS circuitry can be used, while at the same time, having very little, if any, adverse effect on differential data signal transmission speed.

30 Claims, 5 Drawing Sheets

CIRCUITS, ARCHITECTURES, SYSTEMS AND METHODS FOR OVERVOLTAGE PROTECTION

RELATED APPLICATIONS

This application is a continuation of U.S. application No. 10/606,907 filed Jun. 26, 2003, is now a U.S. Pat. No. 7,026,839.

FIELD OF THE INVENTION

The present invention generally relates to the field of overvoltage protection. More specifically, embodiments of the present invention pertain to circuitry, architectures, and methods for protecting against transient and direct current (DC) overvoltages in a device receiving a high-speed differential analog signal.

DISCUSSION OF THE BACKGROUND

FIG. 1 shows a conventional high-speed differential analog circuit 10. Differential circuit 10 includes differential input terminals Rx+ and Rx−, input buffer 12, termination resistors 14 and 16, common mode resistor 18, and conventional common mode voltage source 20. Differential input terminals Rx+ and Rx− are configured to receive a single differential input signal. Termination resistors 14 and 16 typically have the same resistance. Common mode voltage source 20 provides a common mode voltage $V_{COMMON}$ to common mode resistor 18. The operation of this conventional circuit is well-known.

Input buffers, including differential analog input buffers such as input buffer 12, typically require some kind of protection against overvoltages that may be inadvertently applied to a terminal thereof. For example, both externally-applied DC and alternating current (AC) power sources are configured to provide a nominal power supply, or standard voltage, to an integrated circuit (IC) for its operation. On occasion, these power sources may pass transient or sustained voltages significantly above nominal to the IC. In addition, human handlers and/or electronic equipment may carry or generate a significant static electrical charge, sometimes on the order of a thousand to two thousand volts or more. For example, when such a human handler inadvertently touches the leads of an IC and passes such a high static charge to an input buffer on the IC, significant (and sometimes fatal) damage can be done to the IC if the IC is without some kind of protection against such overvoltages.

FIG. 2 shows a conventional high-speed differential analog circuit 50, further equipped with conventional overvoltage protection devices 52 and 54. Differential analog circuit 50 is structurally the same as differential analog circuit 10 of FIG. 1, but with the addition of overvoltage protection devices 52 and 54 to differential input nodes 56 and 58. Overvoltage protection devices 52 and 54 generally provide a low-energy conductance path for overvoltages that are inadvertently applied to the input buffer terminals or leads Rx+ and Rx− to be safely carried to a ground potential, away from the overvoltage-sensitive transistors and other circuitry that may make up the input buffer 12. The operation, structure and design of conventional overvoltage protection devices 52 and 54 are also quite well-known.

However, overvoltage protection devices 52 and 54 are electrically connected to input nodes 56 and 58. As a result, the RC time constant associated with input nodes 56 and 58 is higher than the corresponding RC time constant associated with input nodes 26 and 28 of the circuit 10 of FIG. 1. As a result, the high-speed performance and capabilities of circuit 50 and any IC including it are slightly degraded, relative to circuit 10. Furthermore, overvoltage protection devices 52 and 54 are generally in relatively close physical proximity to input nodes 56 and 58, creating additional parasitic capacitances that do not affect input nodes 26 and 28 of the circuit 10 of FIG. 1. These additional parasitic capacitances further degrade the high-speed performance and capabilities of circuit 50, relative to circuit 10.

As signal transmission speeds increase, a need exists to retain or preserve maximum speed and performance of differential analog input circuitry. However, as IC operating voltages and transistor sizes decrease, the need to protect overvoltage-sensitive devices on an IC is felt even more strongly felt.

SUMMARY OF THE INVENTION

Embodiments of the present invention relate to circuitry, architectures, systems and methods for protecting high-speed differential circuitry from potentially damaging overvoltages. The circuitry generally comprises (a) a differential signal transmission line, (b) a common mode circuit coupled to and configured to reduce a swing of the differential signal transmission line, and (c) an overvoltage protection circuit coupled to the common mode circuit, wherein the common mode circuit is electrically interposed between the overvoltage protection circuit and the differential signal transmission line. The architectures and/or systems generally comprise an integrated circuit (IC) that includes a circuit embodying one or more of the inventive concepts disclosed herein. The method generally comprises the steps of (1) receiving a differential signal in the differential circuit, (2) controlling a voltage swing of the differential signal with a termination circuit coupled to the differential circuit, and (3) when the differential circuit receives the overvoltage, shunting the overvoltage to a ground potential through the termination circuit, and otherwise, processing the differential signal through circuitry coupled to the differential circuit.

The present invention advantageously provides a level of overvoltage protection that is adequate for nearly all applications in which conventional CMOS circuitry can be used, while at the same time, having very little, if any, adverse effect on the speed with which differential data signals may be transmitted on differential signal transmission lines to which the invention is applied.

These and other advantages of the present invention will become readily apparent from the detailed description of preferred embodiments below.

DETAILED DESCRIPTION OF THE PREFERRED EMBODIMENTS

Figure 1:
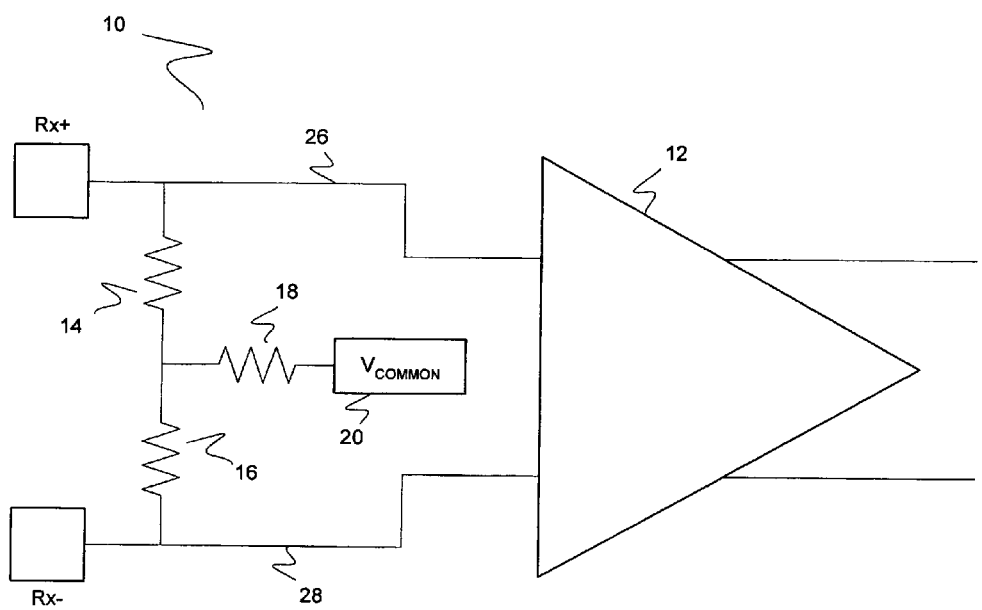
FIG. 1 is a diagram showing a conventional high-speed differential analog circuit.

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On, the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be readily apparent to one skilled in the art that the present invention may be practiced without these specific details. In other instances, well-known methods, procedures, components, and circuits have not been described in detail so as not to unnecessarily obscure aspects of the present invention.

Some portions of the detailed descriptions which follow are presented in terms of processes, procedures, logic blocks, functional blocks, processing, and other symbolic representations of operations on data bits, data streams or waveforms within a computer, processor, controller, circuit, circuit block and/or memory. These descriptions and representations are generally used by those skilled in the data processing arts to effectively convey the substance of their work to others skilled in the art. A process, procedure, logic block, function, process, etc., is herein, and is generally, considered to be a self-consistent sequence of steps or instructions leading to a desired and/or expected result. The steps generally include physical manipulations of physical quantities. Usually, though not necessarily, these quantities take the form of electrical, magnetic, optical, or quantum signals capable of being stored, transferred, combined, compared, and otherwise manipulated in a computer or data processing system. It has proven convenient at times, principally for reasons of common usage, to refer to these signals as bits, waves, waveforms, streams, values, elements, symbols, characters, terms, numbers, or the like.

It should be borne in mind, however, that all of these and similar terms are associated with the appropriate physical quantities and are merely convenient labels applied to these quantities. Unless specifically stated otherwise and/or as is apparent from the following discussions, it is appreciated that throughout the present application, discussions utilizing terms such as "processing," "operating," "computing," "calculating," "determining," "manipulating,""transforming," "displaying" or the like, refer to the action and processes of a computer or data processing system, or similar processing device (e.g., an electrical, optical, or quantum computing or processing device), that manipulates and transforms data represented as physical (e.g., electronic) quantities. The terms refer to actions and processes of the processing devices that manipulate or transform physical quantities within the component(s) of a system or architecture (e.g., registers, memories, other such information storage, transmission or display devices, etc.) into other data similarly represented as physical quantities within other components of the same or a different system or architecture.

Furthermore, for the sake of convenience and simplicity, the terms "time," "rate," and "frequency" are generally used interchangeably herein, but are generally given their art-recognized meanings. Also, for convenience and simplicity, the terms "data," "data stream," "waveform" and "information" may be used interchangeably, as may the terms "connected to," "coupled with," "coupled to" and "in communication with," as well as the terms "lines," "conduits," "traces," "paths," "wires" and "channels," but these terms are also generally given their art-recognized meanings. In addition, the term "differential" signal generally refers to a signal transmitted along two separate, but complementary, lines where the value of the data in the signal may be determined at least in part by the difference between the values of voltages or relative voltage levels on the complementary lines.

The present invention concerns a circuit, architecture, system and method for protecting overvoltage-sensitive circuitry against inadvertent overvoltages. The circuit generally comprises (a) a differential signal transmission line, (b) a common mode circuit coupled to and configured to reduce a swing of the differential signal transmission line, and (c) an overvoltage protection circuit coupled to the common mode circuit, wherein the common mode circuit is electrically interposed between the overvoltage protection circuit and the differential signal transmission line. In preferred embodiments, the common mode circuit includes at least two resistors in series, and the overvoltage protection circuit comprises at least one diode.

A further aspect of the invention concerns an integrated circuit architecture, comprising first and second input terminals configured to receive a differential signal, an input buffer configured to receive the differential signal, and the present circuit, wherein the differential signal transmission line communicates the differential signal from the input terminals to the input buffer. An even further aspect of the invention concerns a system, generally comprising the present (integrated) circuit, embodying the inventive concepts described herein.

Even further aspects of the invention concern a method of protecting a differential circuit from an overvoltage, comprising the steps of (a) receiving a differential signal in the differential circuit, (b) controlling a voltage swing of the differential signal with a termination circuit coupled to the differential circuit, and (c) when the differential circuit receives the overvoltage, shunting the overvoltage to a ground potential through the termination circuit, and otherwise, processing the differential signal through circuitry coupled to the differential circuit.

The invention, in its various aspects, will be explained in greater detail below with regard to exemplary embodiments.

A First Exemplary Circuit

In one aspect, the present invention relates to a circuit, comprising (a) a differential signal transmission line, (b) a common mode circuit coupled to and configured to reduce a swing of the differential signal transmission line, and (c) an overvoltage protection circuit coupled to the common mode circuit, wherein the common mode circuit is electrically interposed between the overvoltage protection circuit and the differential signal transmission line.

Figure 3:
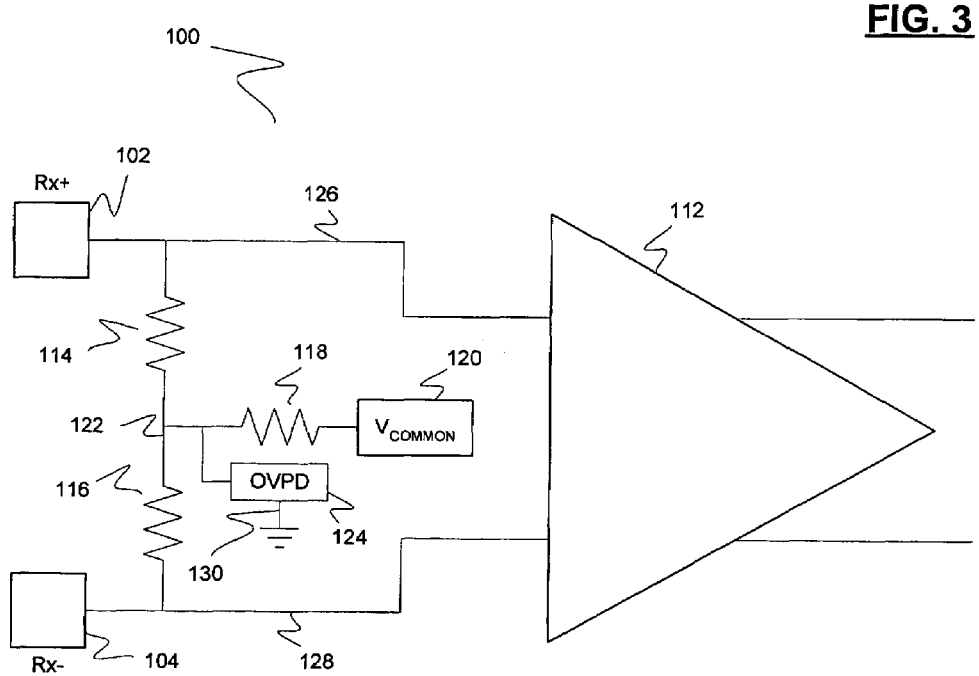
FIG. 3 is a diagram showing a first generic embodiment of the present differential analog circuit including a common mode overvoltage protection device.

FIG. 3 shows a first embodiment of the present differential analog circuit 100 including complementary differential signal transmission line conduits 126 and 128, buffer 112, a common mode circuit including resistors 114, 116 and 118 (in which a termination circuit may comprise resistors 114 and 116 and node 122), and "common mode" overvoltage protection device 124. Conduits 126 and 128 exemplify a differential signal transmission line, as described above. In the present exemplary circuit, conduits 126 and 128 may be respectively connected to differential signal pads (or terminals) 102 (Rx+) and 104 (Rx−). In one embodiment, the differential signal pads 102 and 104 comprise input, or differential data signal receiving, pads.

As shown in FIG. 3, the common mode circuit comprises first and second resistors 114 and 116, in series between complementary differential signal transmission line conduits 126 and 128. Resistors 114 and 116 may be referred to as "termination" resistors, and are commonly employed in electronic circuit design to "terminate," or reduce or minimize reflection (or "bounce-back") of, a signal transmission along a path external to the integrated circuit on which the resistors are located. Resistors 114 and 116 may therefore have a similar or equal resistance. Typically, the resistance of resistor 114 is the same as the resistance of resistor 116. Such resistors typically have a resistance of from 10 Ohms to 1000 Ohms, preferably from 20 Ohms to 200 Ohms, more preferably from 25 Ohms to 100 Ohms. In one implementation, each of resistors 114 and 116 has a resistance of 50 Ohms.

In the present exemplary circuit, overvoltage protection device ("OVPD") 124 is coupled to (i) a node 122 between resistors 114 and 116 which may receive an overvoltage from one or both of conduits 126 and/or 128, and (ii) a low-impedance node 130, such as a power supply node (e.g., Vcc), a virtual ground node, or as shown in FIG. 3, a ground potential (e.g., Vss). The circuit may have a small resistor, a so-called "leaker" transistor (i.e., a PMOS or NMOS transistor such as those shown in FIGS. 4C and/or 4D), or other low-impedance device between the low-impedance node and OVPD 124.

A node between termination resistors in series may be referred to herein as a "common mode node," and is generally configured to receive a common mode voltage from a conventional common mode voltage generator 120, directly or more preferably through one or more conventional common mode resistors (e.g., resistor 118). Thus, the present common mode circuit may further comprise a third resistor configured to receive a common mode voltage, and this third resistor may be coupled to a common mode node between the termination resistors.

Optionally, the present circuit may further comprise a common mode voltage generator, which may be configured to apply a common mode voltage to the common mode circuit. Preferably, the absolute value of the difference between the common mode voltage $V_{COMMON}$ and low-impedance node 130 is greater than the turn-on (or threshold) voltage of OVPD 124 $V_{t(OVPD)}$. In other words, when low-impedance node 130 is Vss, $V_{COMMON}$ should be less than Vss−$V_{t(OVPD)}$, and when low-impedance node 130 is Vcc, $V_{COMMON}$ should be greater than Vcc+$V_{t(OVPD)}$.

As further shown in the exemplary circuit of FIG. 3, the present overvoltage protection circuit 124 may also be coupled to common mode node 122 between termination resistors 114 and 116. Thus, common mode circuitry (e.g., resistors 114 and 116) may be electrically interposed between overvoltage protection circuit 124 and the differential signal transmission line 126/128. Decoupling the direct connection from one of complementary differential signal transmission line conduits 126 and 128 to overvoltage protection device 124 reduces, minimizes and/or eliminates any additional resistance or capacitance (direct and/or parasitic) that the overvoltage protection devices 52 and 54 of FIG. 2 would otherwise contribute to the overall RC constant of high-speed differential analog circuit 50 if coupled directly to one or both of conduits 126 and/or 128.

One should take appropriate steps to increase the likelihood that any overvoltage on either or both of conduits 126 and 128 takes the appropriate path to the overvoltage protection device 124, and is not inadvertently applied to overvoltage-sensitive transistors within input buffer 112 or common mode voltage generator 120. Thus, common mode resistor 118 may have a resistance at least ten times greater than the resistance of each of the termination resistors 114 and 116, and preferably at least one hundred times greater than the resistance of the first and second resistors. In one implementation, common mode resistor 118 has a resistance about 600 times greater than the resistance of each of the termination resistors 114 and 116.

As shown in FIG. 3, the exemplary differential analog circuit may further comprise an input buffer 112 configured to receive a differential signal from the differential signal transmission line 126 and 128. To effectively protect input buffer 112 from overvoltages on differential signal transmission line conduits 126 and 128 and direct the electronic flow of any such overvoltage towards overvoltage protection device 124, the termination resistors 114 and 116 may each have a resistance less than the resistance of input buffer 112. In practice, input buffer 112 comprises a plurality of transistors that receive a differential signal from the differential signal transmission line conduits 126 and 128. These input buffer transistors have a characteristic impedance that is effectively imparted by input buffer 112 onto signals on and/or upstream devices directly coupled to conduits 126 and 128. The real number component of the input buffer impedance is its resistance. Thus, in a preferred embodiment, termination resistors 114 and 116 each have a resistance less than a resistance component of an impedance of input buffer 112.

Figure 2:
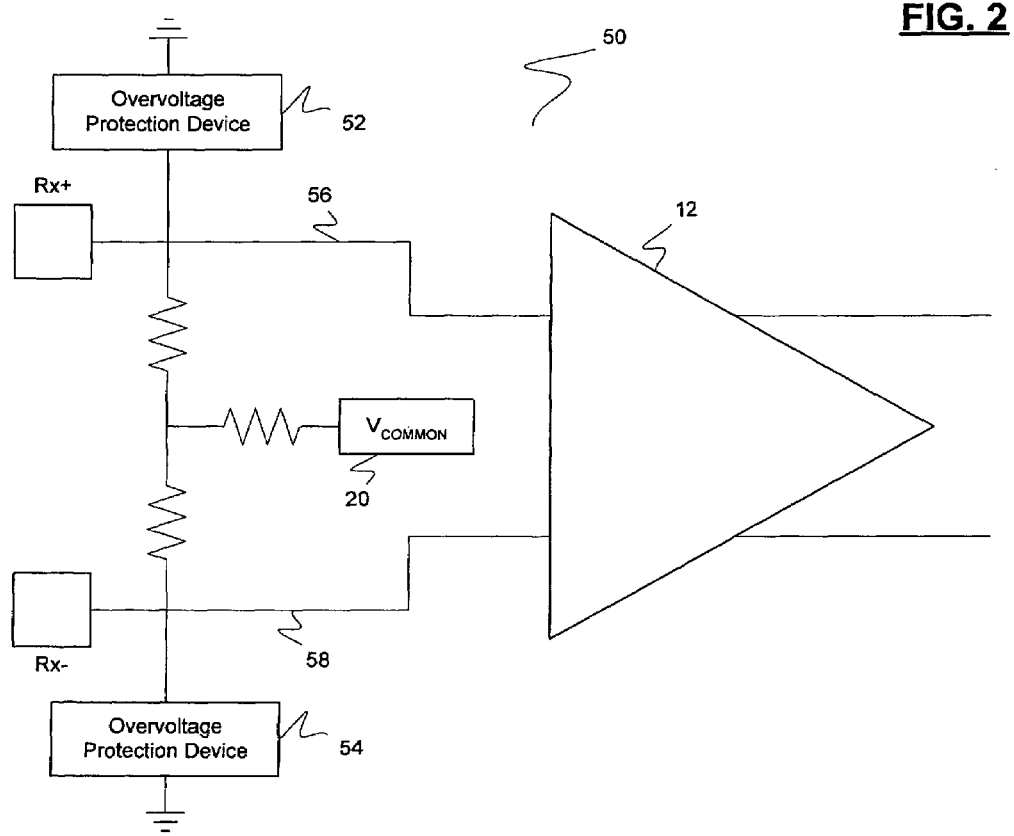
FIG. 2 is a diagram showing a conventional high-speed differential analog circuit equipped with conventional overvoltage protection devices.

Similar to FIGS. 1 and 2, FIG. 3 further shows input terminals Rx+ and Rx−, configured to receive a differential signal for the differential signal transmission line. The differential signal may comprise differential data, and is preferably a differential analog data stream. The present invention is particularly advantageous when employed for high-speed differential analog data transmissions. Therefore, in preferred embodiments, the differential signal received by differential signal transmission line 126/128 has a transmission speed of at least 900 Mbits/sec, preferably at least about 1 Gbit/sec, more preferably at least about 1.5 Gbit/sec, and even more preferably at least about 2 Gbit/sec.

As shown in FIG. 3, the differential signal transmission line may comprise a first conduit 126 and a second conduit 128, where second conduit 128 is complementary to first conduit 126. Conduits 126 and 128 effectively transfer the differential signal from input terminals Rx+ and Rx− to input circuitry on an IC (e.g., input buffer 112). Also because of its particular advantage in high-speed differential analog data transmissions, the differential signal transmission line in the present circuit may has a maximum voltage swing of less than 2 volts, preferably less than 1.5 volts, more preferably less than 1.2 volts, and even more preferably less than 1 volt. It is well within the skill of one skilled in the art to design and implement common mode voltage generator circuitry and resistors (such as resistors 114, 116 and 118) configured to reduce the voltage swing on conduits 126 and 128.

Figure 4A:
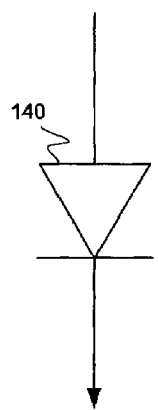
FIGS. 4A–4D are diagrams showing different implementations of the common mode overvoltage protection device of FIG. 3.
Figure 4B:
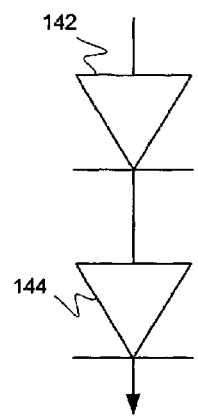

FIGS. 4A–4D show a number of suitable examples of the overvoltage protection device 124. FIG. 4A shows a first embodiment, in which the overvoltage protection circuit comprises a diode 140. In a preferred embodiment, diode 140 has a threshold voltage (e.g., for conduction of an electrical potential applied to it) that is greater than the voltage swing of the differential signal transmission line 126/128. FIG. 4B shows a second embodiment, in which the overvoltage protection circuit comprises two diodes 142 and 144 in series. However, the present invention is not limited to the two examples shown in FIGS. 4A–4B, and any number of diodes coupled in series and/or in parallel can adequately serve as the overvoltage protection device 124.

Figure 4C:
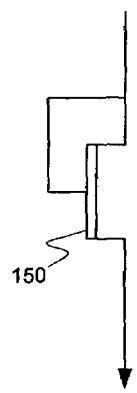
Figure 4D:
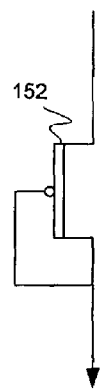

FIG. 4C shows a conventional n-channel transistor 150, configured as a diode (i.e., with its gate and a source/drain terminal commonly coupled to the common mode node) and adapted to shunt any overvoltage received by differential circuit 100 to a ground potential. FIG. 4D shows an equivalent device, conventional p-channel transistor 152, configured as a diode (i.e., with its gate and a source/drain terminal commonly coupled to the ground potential) and adapted to shunt any overvoltage received by differential circuit 100 to a ground potential. Alternatively, a conventional electrostatic discharge device (other than the diodes and/or diode-configured transistors shown in FIGS. 4A–4D) and/or a conventional silicon controlled rectifier may be employed as or in the overvoltage protection device 124. It is well within the abilities of one skilled in the art to design and use resistors, diodes and diode-configured transistors to shunt overvoltages safely to a ground potential and away from overvoltage-sensitive input circuitry on an IC.

A Second Exemplary Circuit

Figure 5:
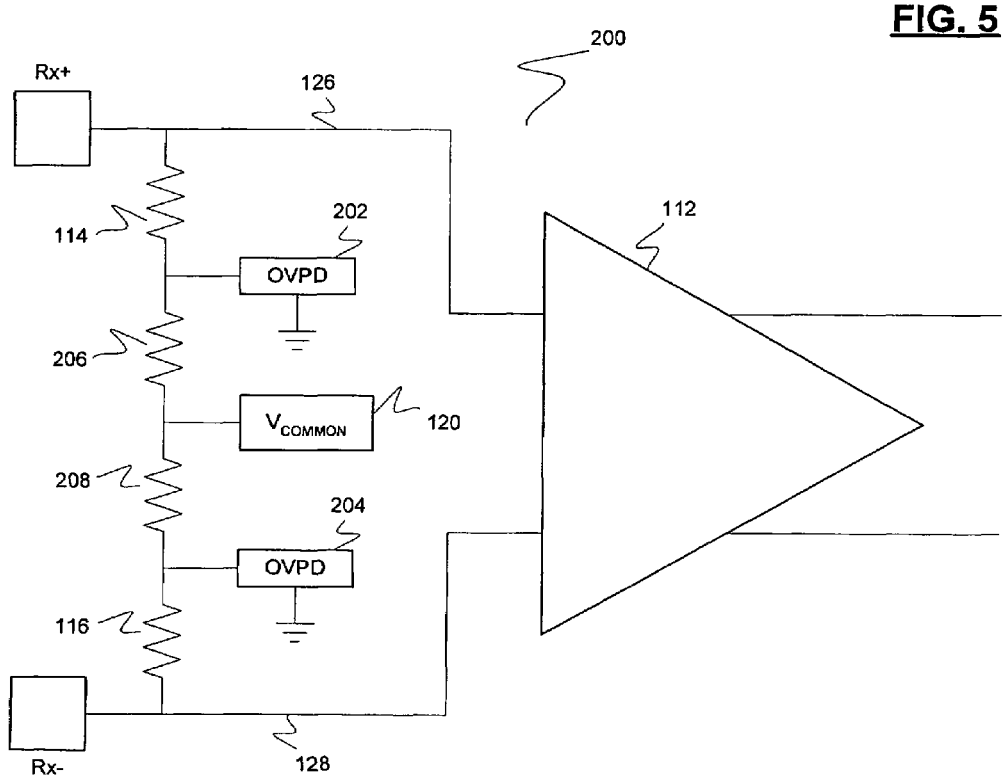
FIG. 5 is a diagram showing a second embodiment of the present differential analog circuit.

FIG. 5 shows a second exemplary circuit, including first and second overvoltage protection devices (OVPDs) 202 and 204, respectively coupled to common mode node terminals of termination resistors 114 and 116 away from differential signal transmission line conduits 126 and 128. In this case, common mode voltage generator 120 provides a common mode voltage to common mode resistors 206 and 208, which operate essentially identically to common mode resistor 118 of FIG. 3. In this case, each conduit of differential signal transmission line 126/128 effectively has a dedicated OVPD.

An Exemplary Integrated Circuit Architecture

In another aspect, the present invention concerns an integrated circuit architecture that includes circuitry for protecting against overvoltages, such as the exemplary circuitry of FIGS. 3–5. In a preferred embodiment, the integrated circuit comprises first and second input terminals configured to receive a differential signal, an input buffer configured to receive the differential signal, and the present circuit, wherein the differential signal transmission line communicates the differential signal from the input terminals to the input buffer.

The System and Network

In a further aspect of the invention, the system is configured to transfer data on or across a network. The system generally comprises the above-described integrated circuit, at least one transmitter communicatively coupled to the first and second input terminals, the transmitter being configured to transmit a differential data signal; and at least one receiver communicatively coupled to the input buffer, the receiver being configured to receive the differential data signal. In a preferred embodiment, the integrated circuit further comprises the receiver.

In a further aspect, the present invention relates to a network, comprising (i) a plurality of the above-described systems, communicatively coupled to each other, and (ii) a plurality of storage or communications devices, each of the storage or communications devices being communicatively coupled to one of the systems. In a preferred embodiment, at least a plurality (and more preferably each) of the storage or communications devices comprises a storage device.

In further embodiments, the system may be configured to convert serial data from the network to parallel data for a downstream device, and convert parallel data from the downstream device to serial data for, e.g., a storage device in the network. The network may be any kind of known network, such as a storage network (e.g., RAID array), Ethernet, or wireless network, but preferably, the network comprises a storage network.

An Exemplary Method

The present invention further relates to method of method of protecting a differential circuit from an overvoltage, comprising the steps of (a) receiving a differential signal in the differential circuit, (b) controlling a voltage swing of the differential signal with a termination circuit coupled to the differential circuit, and (c) when the differential circuit receives the overvoltage, shunting the overvoltage to a ground potential through the termination circuit, and otherwise, processing the differential signal through circuitry coupled to the differential circuit. As described above, in one implementation, the differential circuit being protected comprises a differential input buffer.

In the present method, the shunting step may comprise passing the overvoltage through at least one diode, preferably where the diode has a threshold voltage greater than a voltage swing of the differential signal transmission line. In further embodiments, shunting may comprise passing the overvoltage through at least two diodes in series, and the diode(s) may comprise one or more diode-configured transistors.

As described above, the controlling step may comprise applying a common mode voltage to the common mode node, and the common mode voltage may be applied to the common mode node through a resistor having a resistance greater than a resistance component of an impedance of the downstream circuitry. Thus, the method may also further comprise the step(s) of (i) generating the common mode voltage, (ii) buffering the differential signal.

As for the exemplary circuit(s) described above, the differential circuit in the present method may comprise (i) first and second input pads, which may be configured to receive an externally generated differential signal, and (ii) a differential signal transmission line electrically coupled to the first and second input pads. Furthermore, the termination circuit may comprise a first resistor coupled to a first conduit of the differential signal transmission line, a second resistor coupled to a second conduit of the differential signal transmission line, and a common mode node between the first and second resistors, wherein the second conduit is complementary to the first conduit.

One object of the method is to enable satisfactory overvoltage protection for overvoltage-sensitive circuitry coupled to the present differential analog circuit, while at the same time, minimizing or avoiding any adverse effect such overvoltage protection may have on the speed with which the present differential analog circuit transmits and/or transfers differential analog signals that it may carry. Thus, the present method may also relate to steps for configuring a differential analog circuit, comprising (a) providing or selecting termination resistors with a first resistance, (b) providing or selecting common mode resistors with a second resistance at least ten times (and preferably at least one hundred times) greater than the first resistance, (c) providing or selecting an input buffer receiving a differential signal from the present differential circuit with an impedance having a resistance component greater than (preferably at least twice, more preferably at least five times, and even more preferably at least ten times) the first resistance, and/or (d) providing or selecting a diode for the overvoltage protection circuit with a threshold voltage greater than (preferably at least about 1.1 times, more preferably from about 1.1 times to about 1.5 times) the maximum voltage swing of the differential signal transmission line.

CONCLUSION/SUMMARY

Thus, the present invention provides a circuit, architecture, system and method for protecting overvoltage-sensitive high-speed differential circuitry from an overvoltage. The circuitry generally comprises (a) a differential signal transmission line, (b) a common mode circuit coupled to and configured to reduce a swing of the differential signal transmission line, and (c) an overvoltage protection circuit coupled to the common mode circuit, wherein the common mode circuit is electrically interposed between the overvoltage protection circuit and the differential signal transmission line. The architecture and system generally relate to an integrated circuit containing the above-described circuit, and in certain embodiments, to a network including such integrated circuits and/or systems. The method generally includes the steps of (a) receiving a differential signal in the differential circuit, (b) controlling a voltage swing of the differential signal with a termination circuit coupled to the differential circuit, and (c) when the differential circuit receives the overvoltage, shunting the overvoltage to a ground potential through the termination circuit, and otherwise, processing the differential signal through circuitry coupled to the differential circuit. The present invention protects overvoltage-sensitive differential and/or analog circuitry from intermittent and/or prolonged overvoltages, while at the same time, having very little, if any, adverse effect on differential signal transmission speed.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A circuit, comprising:
a) a differential signal transmission line;
b) a common mode circuit comprising first and second resistances in series and an internal node, said common mode circuit in communication with said differential signal transmission line, configured to reduce a swing of said differential signal transmission line; and
c) at least one overvoltage protection circuit in communication with said internal node of said common mode circuit, wherein at least part of said common mode circuit is electrically interposed between said overvoltage protection circuit and said differential signal transmission line.

2. The circuit of claim 1, wherein said common mode circuit comprises first and second resistors in series.

3. The circuit of claim 2, wherein said first and second resistors comprise first and second termination resistors.

4. The circuit of claim 2, further comprising an input buffer configured to receive a differential signal from said differential signal transmission line.

5. The circuit of claim 4, wherein said first and second resistors each have a resistance less than a resistance component of an impedance of said input buffer.

6. The circuit of claim 1, wherein said common mode circuit further comprises a third resistor configured to receive a common mode voltage.

7. The circuit of claim 6, wherein said third resistor is coupled to said internal node.

8. The circuit of claim 7, wherein said third resistor has a resistance at least ten times greater than a resistance of said first and second resistors.

9. The circuit of claim 1, wherein said common mode circuit comprises first and second resistors in series between first and second conduits of said differential signal transmission line, and said internal node is between said first and second resistors.

10. The circuit of claim 1, wherein said overvoltage protection circuit comprises at least one diode having a threshold voltage greater than a voltage swing of said differential signal transmission line.

11. The circuit of claim 10, wherein said differential signal transmission line has a maximum voltage swing of less than 2 volts.

12. An integrated circuit, comprising:
a) first and second input terminals configured to receive a differential signal;
b) an input buffer configured to receive said differential signal; and
c) the circuit of claim 1, wherein said differential signal transmission line communicates said differential signal from said input terminals to said input buffer.

13. A system for transferring data on or across a network, comprising:
a) the integrated circuit of claim 12;
b) at least one transmitter communicatively coupled to said first and second input terminals, said transmitter being configured to transmit a differential data signal; and
c) at least one receiver communicatively coupled to said input buffer, said receiver being configured to receive said differential data signal.

14. A network comprising:
a) a plurality of the systems of claim 13, communicatively coupled to each other; and
b) a plurality of storage or communications devices, each of said storage or communications devices being communicatively coupled to one of said systems.

15. A circuit, comprising:
a) means for transferring a differential signal;
b) means for reducing a swing of said means for transferring; and
c) at least one means for protecting circuitry to which said differential signal is to be transferred from an overvoltage, wherein at least part of said means for reducing is electrically interposed between said at least one means for protecting and said means for transferring.

16. The circuit of claim 15, wherein said means for reducing comprises first and second resistors in series.

17. The circuit of claim 15, wherein said means for reducing comprises a means for applying a common mode voltage.

18. The circuit of claim 17, wherein said means for applying is coupled to a node between fist and second means for terminating said differential signal.

19. The circuit of claim 17, wherein said means for applying a common mode voltage comprises a resistor receiving said common mode voltage.

20. The circuit of claim 15, wherein said means for transferring has a maximum voltage swing of less than 2 volts.

21. An integrated circuit, comprising:
   a) means for receiving a differential signal;
   b) means for buffering said differential signal; and
   c) the circuit of claim 15, wherein said means for transferring communicates said differential signal from said means for receiving to said means for buffering.

22. A system for transferring data on or across a network, comprising:
   a) the integrated circuit of claim 21;
   b) at least one means for transmitting a differential data signal, communicatively coupled to said means for transferring; and
   c) at least one means for receiving said differential data signal, communicatively coupled to said means for buffering.

23. A network, comprising:
   a) a plurality of the systems of claim 22, communicatively coupled to each other; and
   b) a plurality of means for storing or communicating, each of said means for storing or communicating being communicatively coupled to one of said systems.

24. A method of protecting a differential circuit from an overvoltage, comprising the steps of:
   a) receiving a differential signal in said differential circuit;
   b) controlling a voltage swing of said differential signal with a termination circuit in communication with said differential circuit, said termination circuit comprising first and second resistances in series and an internal node; and
   c) when said differential circuit receives said overvoltage, shunting said overvoltage to a low impedance node through said termination circuit, and otherwise, processing said differential signal through circuitry coupled to said differential circuit.

25. The method of claim 24, wherein said shunting comprises passing said overvoltage through at least one diode.

26. The method of claim 24, wherein said low impedance node comprises a power supply node, a virtual ground node or a ground potential.

27. The method of claim 24, wherein said controlling step comprises applying a common mode voltage to said internal node.

28. The method of claim 27, wherein said common mode voltage is applied to said internal node through a resistor having a resistance greater than a resistance component of an impedance of said circuitry.

29. The method of claim 24, wherein:
   a) said differential circuit comprises (i) first and second input pads and (ii) a differential signal transmission line electrically coupled to said fist and second input pads; and
   b) said termination circuit comprises a first resistor coupled to a first conduit of said differential signal transmission line, a second resistor coupled to a second conduit of said differential signal transmission line, wherein said internal node is between said first and second resistors.

30. A circuit, comprising:
   a) a differential input signal;
   b) a voltage divider in communication with said differential input signal, configured to reduce a swing of said differential signal transmission line and having first and second nodes coupled to differential input signal;
   c) a common mode voltage coupled to a third node in said voltage divider;
   d) a first overvoltage protection circuit coupled to a fourth node in said voltage divider; and
   e) a second overvoltage protection circuit coupled to a fifth node in said voltage divider, said third node being between said fourth and fifth nodes.

* * * * *